United States Patent [19]

Nishimura et al.

[11] Patent Number: 4,965,511

[45] Date of Patent: Oct. 23, 1990

[54] TEST CIRCUIT FOR LOGIC ICS

[75] Inventors: Akira Nishimura, Yokohama; Yasuyuki Nozuyama, Tokyo, both of Japan

[73] Assignee: Kabushiki Kaisha Toshiba, Kawasaki, Japan

[21] Appl. No.: 370,046

[22] Filed: Jun. 22, 1989

[30] Foreign Application Priority Data

Jun. 22, 1988 [JP] Japan .................................. 63-154016

[51] Int. Cl.$^5$ ............................................ G01R 15/12
[52] U.S. Cl. .................................. 324/73.1; 324/158 R
[58] Field of Search ............ 324/73 R, 73 AT, 158 R; 371/20.4, 25.1, 15.1

[56] References Cited

U.S. PATENT DOCUMENTS

| | | | |
|---|---|---|---|
| 3,959,770 | 5/1976 | Schaefer | 371/20.4 |
| 4,404,519 | 9/1983 | Westcott | 324/73 R |
| 4,571,724 | 2/1986 | Belmondo et al. | 324/73 R |
| 4,577,318 | 3/1986 | Whitacre et al. | 324/73 R |

Primary Examiner—Reinhard J. Eisenzopf
Assistant Examiner—Vinh P. Nguyen
Attorney, Agent, or Firm—Foley & Lardner, Schwartz, Jeffery, Schwaab, Mack, Blumenthal & Evans

[57] ABSTRACT

A test circuit targeted to test data path blocks such as an arithmetic block to be tested including an arithmetic unit for operating multiple bits as well as including various registers related to the arithmetic unit. The test circuit includes flip-flops for receiving data from a first pin forming a shift register, having the ability of holding data by the control of a test node signal multiplexers for selectively generating control signals for controlling the elements in the data path block to be tested, a second pin connected to the flip-flops and multiplexers to externally provide them with a test mode signal under a test mode, a bus switch connected between a third pin and an internal data bus to control input of test data from the third pin to the arithmetic block and input of an operation result to the third pin via the internal data bus, gates for controlling data input and output with respect to the bus switch, and a timing signal generator for generating timing signals for controlling the gates. At the time of test, the second pin provides the test mode signal. According to this signal, the flip-flops hold test control data, while the multiplexers generate control signals based on the timing signals to test the arithmetic block at high speed.

4 Claims, 5 Drawing Sheets

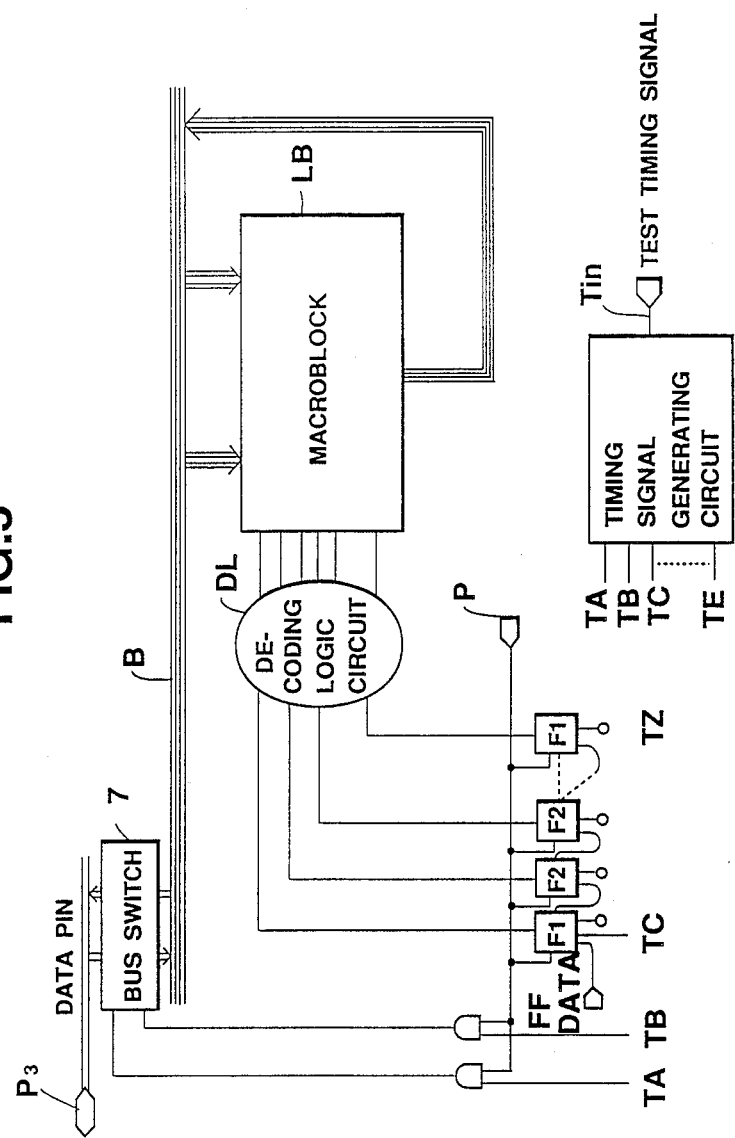

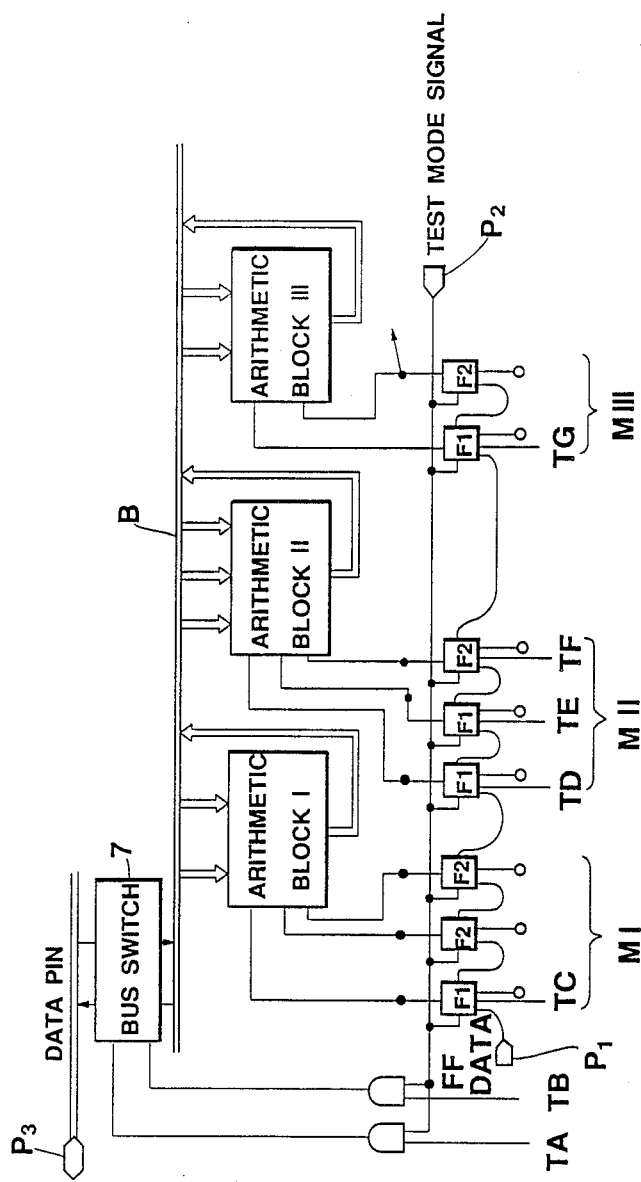

TEST CIRCUIT FOR LOGIC ICS

BACKGROUND OF THE INVENTION

1. Field of the Invention

The present invention relates to a test circuit of a logic LSIs to improve efficiency of testing the logic circuit inside. The test facilitating circuit is generally applicable to data path circuit in an LSI having bus structure such as an arithmetic circuit.

2. Description of the Prior Art

To test a logic circuit, particularly a combinational circuit of large scale integrated (LSI) circuit, a scan pass method and an ad hoc method are widely known to be effective.

According to the scan path method, flip-flops in a logic circuit are used as a shift register to form a scan path. The flip-flops are directly controlled from the outside to test the logic circuit, and then a result of the test is observed by the flip-flops. Namely, sequential circuits including flip-flops are rearranged as a combinational circuit by modifying flip-flops to shift register which is directly controllable and observable according to the scan path method to achieve the test. The scan path method is reliable and effective if testing time and additional hardware are allowed to increase considerably. However, the scan path method is frequently employed to test LSI logic circuits.

The conventional scan path method will be explained with reference to FIG. 1. In the figure, an arithmetic circuit comprises an adder AD, input registers A and B, a data register D, an output inverting device I, an internal data bus B, an output driver BL, and a decoding logic circuit $L_1$. The decoding logic circuit $L_1$ generates signals for controlling the circuit elements by decoding the bit pattern of a flip-flop group FF. The registers A and B, data register D and flip-flop group FF are employed to form a scan path according to the scan path method.

The circuit shown in FIG. 1 is a typical example of arithmetic circuit of a microprocessor having bus structure. In the circuit of FIG. 1, two different signal path exist. They are, control signals $C_1$ to $C_6$ and a 32-bit data path in which calculation data is transmitted. Therefore, it is necessary to utilize this characteristic in designing a testing circuit.

According to the scan path method, the flip-flops in the flip-flop group FF are simply connected in series to form a shift register that handles both data and control signals in the test. This is not efficient.

Therefore, the scan path method greatly increases testing time due to data transfer in testing a large scale logic circuit block including various arithmetic circuits because it contains 32 bit registers in the shift register. In addition, complexity of a system increases, the number of bits to be involved in a scan path drastically increases to deteriorate testing efficiency.

Meanwhile, the ad hoc method (not particularly shown but FIG. 1 may be referred to as a reference) inserts gates at nodes which are hard to control and observe from the outside of the LSI, for example, nodes 10 of the control lines between the decoding logic $L_1$ and the adder AD of FIG. 1. The nodes 1 are directly controlled via external pins to carry out a test.

The ad hoc method requires gates to be inserted in the same number as the number of nodes of control lines (six in FIG. 1) to form test points. Moreover, external pins for the exclusive use of test shall be prepared in the same number as the number of the gates. As a result, costs are drastically increased if the number of arithmetic circuits to be tested is increased.

SUMMARY OF THE INVENTION

An object of the present invention is to provide a test circuit of data path block such as arithmetic circuit in the LSI chip to remarkably improve efficiency of testing.

In order to accomplish the object, the present invention provides an optimized test circuit of a logic circuit. The test circuit of the invention targeted to test an arithmetic block as an example. The arithmetic block includes arithmetic means for operating multiple bits, and various registers related to the arithmetic means. The test circuit comprises a plurality of flip-flops for receiving data from a first pin and forming a shift register, a plurality of multiplexers for selectively generating a plurality of control signals for controlling the elements in the arithmetic block to be tested, a second pin connected to the flip-flops and multiplexer to externally provide them with a test mode signal under a test mode, bus switch means connected between a third pin and an internal data bus to control input of test data from the third pin to the arithmetic block and output of an operation result to the third pin via the internal data bus, gate means for controlling data input and output with respect to the bus switch means, and timing signal generating means for generating timing signals for controlling the gate means under the test mode. At the time of testing, the second pin provides the test mode signal. According to the test mode signal, the flip-flops hold data. According to the timing signals, the multiplexers generate control signals to test the arithmetic block at high speed.

These and other objects, features and advantages of the invention will be more apparent from the following detailed description of preferred embodiments in conjunction with the accompanying drawings.

BRIEF DESCRIPTION OF THE DRAWINGS

FIG. 5 is a block circuit diagram showing a test facilitating circuit of a logic circuit, according to a second embodiment of the invention; and FIG. 6 is a block circuit diagram showing a test facilitating circuit of a logic circuit, according to a third embodiment of the invention.

DETAILED DESCRIPTION OF THE EMBODIMENTS

Figure 1:
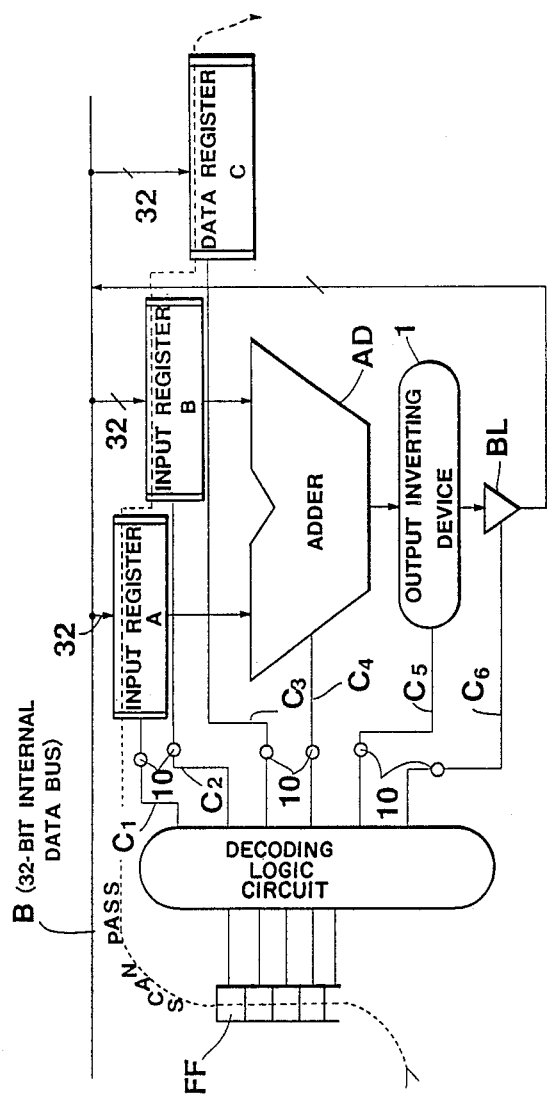
FIG. 1 is a block circuit diagram showing a conventional test method of an arithmetic logic circuit.
Figure 2:
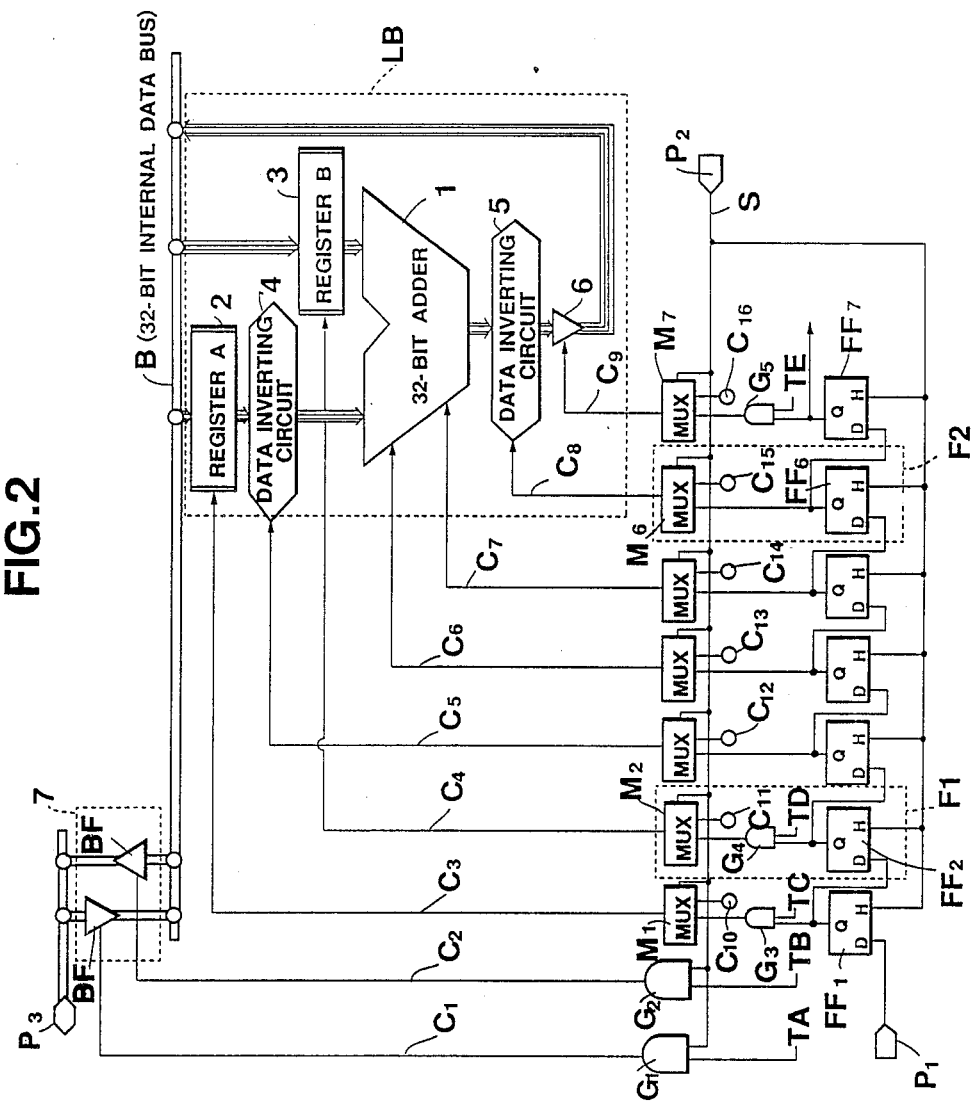
FIG. 2 is a block circuit diagram showing a test facilitating circit of a logic circuit, according to a first embodiment of the invention.

FIG. 2 shows a test circuit of logic circuits, according to the first embodiment of the invention. The circuit of the embodiment employs a 32-bit adder 1 as an example. Around the 32-bit adder 1, there are arranged an input register A2, an input register B3, an input data inverting circuit 4, an output data inverting circuit 5, and an output driver 6 for outputting data to a 32-bit internal data bus B. The adder 1 has an operation mode controlled by two operation control signals $C_6$ and $C_7$.

A block encircled with a dotted line and including the elements around the adder 1 will be referred to as an arithmetic block LB. Control signals $C_3$, $C_4$, $C_5$, $C_8$ and $C_9$ directly control the arithmetic block LB. Control signals $C_1$ and $C_2$ are used for another purpose that will be explained later.

The test facilitating circuit comprises a plurality of flip-flops FFi (i=1 to 7). The flip-flops FFI hold control signals for carrying out a required test in the arithmetic block LB under the test mode. The test circuit further comprises multiplexers Mi (i=1 to 7). The multiplexers Mi are controlled by a test mode signal to selectively supply control signals held in the flip-flops FFi or control signals for normal operation. The $G_3$, $G_4$ and $G_5$ disposed between the flip-flops $FF_1$, $FF_2$ and $FF_7$ and the multiplexers $M_1$, $M_2$ and $M_7$, respectively, to control the operation timing of the input register A2, input register B3 and output driver 6 of the arithmetic block LB. The test circuit further comprises a bus switch 7 for controlling input and output of test data with respect to the internal data bus B, AND gates $G_1$ and $G_2$ for controlling operation of the bus switch 7, and a timing signal generating circuit (FIG. 3) for supplying timing signals TA to TE to the AND gates $G_1$ to $G_5$ to carry out a required test.

The flip-flops FFi (i=1 to 7) except the flip-flop $FF_1$ on the left end side are connected in series such that a D-input terminal and a Q-output terminal of adjacent flip-flops are connected to each other in series, thus forming a shift register. A D-input terminal of the flip-flop $FF_1$ is connected to a data input pin $P_1$. When no test mode signal S is inputted from a pin $P_2$, i.e., when the test mode signal S is 0, data from the pin $P_1$ are shifted in the flip-flops from $FF_1$ to $FF_{i+1}$. However, when the test mode signal S is 1, data set in the flip-flops $FF_i$ are held therein.

The multiplexers Mi (i=1 to 7) receive normal operation control signals $C_{10}$ to $C_{16}$, respectively, and outputs of the flip-flops $FF_1$ to $FF_7$, respectively. When the test mode signal S is 1, the multiplexers Mi output the data held in the respective flip-flops FFi as the control signals $C_3$ to $C_9$. Under the normal operation with the test mode signal S being 0, the multiplexers Mi output the normal operation control signals $C_{10}$ to $C_{16}$ as the control signals $C_3$ to $C_9$.

The internal data bus B is connected to the bus switch 7 that controls input and output of test data with respect to the internal data bus B. The bus switch 7 is connected to the data pin $P_3$ for inputting the test data. The bus switch 7 comprises two tristate buffers controlled by the control signals $C_1$ and $C_2$.

The AND gates $G_i$ (i =1 to 5) operate AND between the timing signals TA, TB, TC, TD and TE generated under the test mode (S=1) and the outputs of the flip-flops FFi to generate output signals according to the AND operation.

Figure 3:
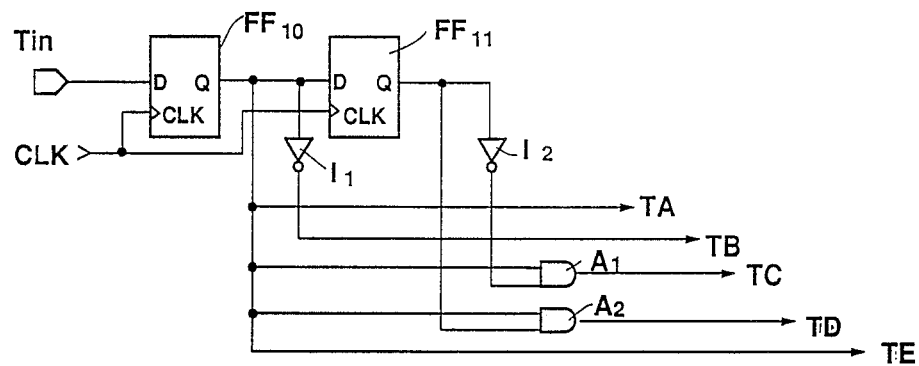
FIG. 3 is a detailed circuit diagram showing a timing signal generating circuit for generating various timing signals shown in FIG. 2.

FIG. 3 shows an example of the timing signals generating circuit for generating the timing signals TA to TE shown in FIG. 2. The timing signal generating circuit comprises two flip-flops $FF_{10}$ and $FF_{11}$, two inverters $I_1$ and $I_2$ and two AND gates $A_1$ and $A_2$. According to test timing signal pin Tin and clock signal pin CLK, the timing signal generating circuit generates the timing signal TA to TE.

Figure 4:
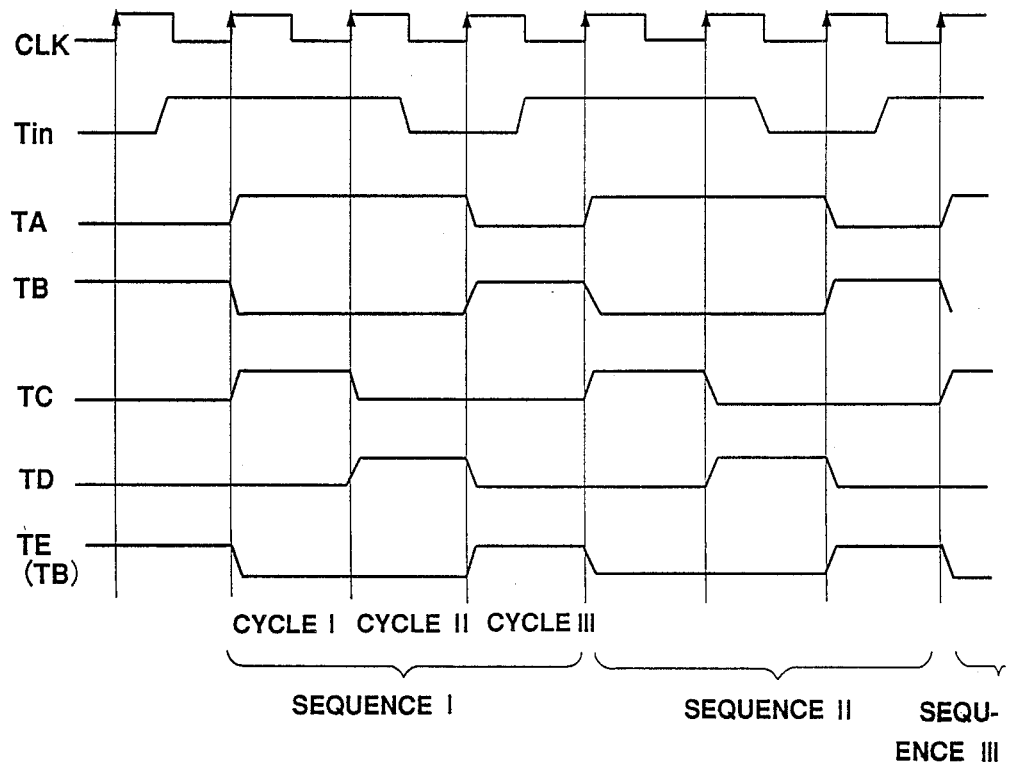
FIG. 4 is a timing chart explaining operation of the circuit shown in FIG. 2.

Operation of the test circuit of the invention will be explained with reference to a timing chart of FIG. 4.

Under normal operation, the test mode signal S from the pin $P_2$ is 0, and the normal operation control signals $C_{10}$ to $C_{16}$ are applied to the respective elements of the arithmetic block BL via the multiplexers $M_1$ to $M_7$. Under the normal operation with the test mode signal S being 0, the test control data from the pin $P_1$ are serially sequentially transferred to the flip-flops FFi. For example, to control bus access timing, a bit pattern of 1010001, i.e., a bit pattern with first, third and seventh bits being 1 is set in the flip-flops FFi. Other bits are set to determine the operational modes of the adder and inverterting circuits.

After the required data are transferred to the flip-flop FFi, the test mode signal S from the pin $P_2$ is set to 1. Then, the contents of the shift register comprising the flip-flops FFi are transmitted to the arithmetic block LB via the multiplexers Mi to prepare for testing the elements of the arithmetic block LB. After that, the testing timing signal Tin is given to the timing signal generating circuit of FIG. 3 to generate the timing signals TA to TE. The AND gates $G_1$ to $G_5$ operate ANDs to provide outputs for controlling the bus switch 7 and multiplexers $M_1$, $M_2$ and $M_7$.

Test execution sequences shown in FIG. 4 will be explained. With the timing signal TA=1 in cycle I of sequence I, test data given to the data pin $P_3$ are outputted to the internal data bus B via the bus switch 7 according to the control signal $C_1$ from the AND gate $G_1$. With the timing signal TC=1, the test data are received by the register A2 from the internal data bus B. Similarly, with the timing signals TA=1 and TD=1 in cycle II, test data from the data pin $P_3$ are received by the register B3 via the internal data bus B. In cycle III, the data in the registers A2 and B3 are added to each other in the adder 1. With the timing signal TE=1, an added result is outputted to the internal data bus B via the bus driver 6. With the timing signal TB=1, the bus switch 7 is switched over such that the added result outputted to the internal data bus B are given to the data pin $P_3$.

In this way, according to the test facilitating circuit of the invention, the adder 1 can be tested once in three cycles, i.e., in the cycles I, II and III. Therefore, by repeating the test sequence in required times, optional tests may be achieved. As is apparent in the timing chart of FIG. 4, a single test of the adder 1 is completed at high speed within three clock cycles after the test mode is established, i.e., after the test mode signal is set to 1.

If the data pin $P_3$ already exists, pins necessary for the test will be the pins $P_1$ and $P_2$ and a pin for the test timing signal Tin. Namely, only three additional pins are needed for the test, thereby reducing hardware overhead.

FIG. 5 shows a test circuit according to the second embodiment of the invention. In FIG. 5, for the sake of simplicity, the second fip-flop $FF_2$, AND gate $G_4$ and multiplexer $M_2$ of FIG. 2 are presented with a reference mark $F_1$, while the sixth flip-flop $FF_6$ and multiplexer $M_6$ of FIG. 2 are represented with a reference mark $F_2$. The adder 1 and its related elements of FIG. 2 are represented with an arithmetic block LB in FIG. 5.

Unlike the first embodiment of FIG. 2, the second embodiment of FIG. 5 has a decoding logic circuit DL on respective control lines (nodes) entering the arithmetic block LB. When timing signals TA to TE are generated, the decoding logic circuit DL decodes output signals of the respective elements Fi to provide decoded outputs to the elements in the arithmetic block BL to achieve a test. The decoding logic circuits PL can be tested as well as the LB in this embodiment.

FIG. 6 shows a test facilitating circuit according to the third embodiment of the invention. In this embodiment, a plurality of macroblocks, i.e., arithmetic blocks I, II and III are tested. Flip-flop chains (shift registers) MI, MII and MIII each comprising flip-flops are arranged. Any of the flip-flop chains can be selected to independently test corresponding one of the arithmetic blocks. For example, to selectively test the arithmetic block II, bits each of 0 will be transferred to portions for controlling bus access of the flip-flop chains I and III. Then, the flip-flops I and III are ommitted so that only the arithmetic block II may be tested independently of the others.

In summary, the present invention can test a logic circuit at high speed with small number of pins. In testing a plurality of arithmetic blocks, the present invention can test particular one of the arithmetic blocks selectively and independently of the others.

Various modifications will become possible for those skilled in the art after receiving the teachings of the present disclosure without departing from the scope thereof.

What is claimed is:

1. A test circuit for testing an arithmetic block comprising:
   (a) holding means for holding a test control signal for achieving a predetermined test in the arithmetic block;
   (b) selecting means for selectively supplying one of the control signal supplied from an external pin held in said holding means and a normal operation control signal to the arithmetic block according to a test mode signal;
   (c) switching means for controlling input and output of test data with respect to the arithmetic block;
   (d) gate means for controlling operation of said switching means; and
   (e) timing signal generating means for generating a timing signal for controlling said gate means.

2. The test circuit as claimed in claim 1, wherein, under a normal operation mode in which said selecting means selects the normal operation control signal and supplies the same to the arithmetic block, said holding means serially transfers and hold the test control signal for achieving the predetermined test, and, under a test operation mode, said holding means supplies the test control signal held therein to said selecting means.

3. A test circuit comprising:
   (a) an arithmetic block to be tested including arithmetic means for operating multiple bits as well a including various registers relates to the arithmetic means;
   (b) a plurality of flip-flops for holding test control data supplied from a first pin, said flip-flops being connected to form a shift register;
   (c) a plurality of multiplexers for selectively supplying a plurality of test control signals and normal operation control signals to said arithmetic block to be tested to control respectively elements in the arithmetic block;
   (d) a second pin connected to said flip-flops and multiplexers to provide a test mode signal at the time of test;
   (e) bus switching means connected between a third pin and an internal data bus to control test data input from the third pin to said arithmetic block via the internal data bus as well as outputting operation results from said arithemtic block to the third pin via the internal data bus;
   (f) gate means for controlling data input and output with respect to said bus switching means; and
   (g) timing signal generating means for generating timing signals for controlling said gate means under a test mode,
   (h) under the test mode, said flip-flops holding the test control data and said multiplexers generating the test control signals according to the test mode signal given by said second pin, while the test data being inputted according to the timing signals thus testing said arithmetic block at high speed.

4. The test circuit as claimed in claim 3, further comprising other gate means connected to inputs of predetermined ones of said multiplexers, wherein said timing signal generating means generating means generating other timing signals for controlling the other gate means.

* * * * *